(12) United States Patent
Park et al.

(10) Patent No.: US 7,501,320 B2
(45) Date of Patent: Mar. 10, 2009

(54) SEMICONDUCTOR DEVICE WITH DIELECTRIC STRUCTURE AND METHOD FOR FABRICATING THE SAME

(75) Inventors: Ki-Seon Park, Ichon-shi (KR); Jae-Sung Roh, Ichon-shi (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 226 days.

(21) Appl. No.: 11/285,161

(22) Filed: Nov. 23, 2005

(65) Prior Publication Data

US 2007/0048929 A1 Mar. 1, 2007

(30) Foreign Application Priority Data

Aug. 30, 2005 (KR) .................. 10-2005-0080246

(51) Int. Cl.
*H01L 21/8234* (2006.01)
*H01L 21/8242* (2006.01)

(52) U.S. Cl. .................. 438/238; 438/239; 438/240; 438/253; 438/396; 257/E21.396; 257/E21.647

(58) Field of Classification Search .............. 438/3, 438/238–239, 257–267, 680, 770, 287, 240; 257/E21.253, E21.311, E21.168, E21.301, 257/E21.396, E21.647
See application file for complete search history.

(56) References Cited

U.S. PATENT DOCUMENTS 6,194,754 B1 * 2/2001 Aggarwal et al. ........... 257/295
6,580,118 B2 * 6/2003 Ludwig et al. .............. 257/315
6,825,518 B2 * 11/2004 Park et al. ................... 257/303
7,183,186 B2 * 2/2007 Ahn et al. ................... 438/591
7,288,453 B2 * 10/2007 Jeong et al. ................. 438/238
2002/0175142 A1 * 11/2002 Maejima ........................ 216/6
2004/0063275 A1 * 4/2004 Kim et al. ................... 438/240
2005/0196915 A1 * 9/2005 Jeong et al. ................. 438/238
2006/0151823 A1 * 7/2006 Govindarajan .............. 257/310

FOREIGN PATENT DOCUMENTS

| JP | 10-209403 | 8/1998 |
| KR | 10-2002-64624 | 8/2002 |
| KR | 10-2004-0060443 | 7/2004 |
| KR | 10-2004-60443 A | 7/2004 |
| KR | 10-2004-0100766 | 12/2004 |
| KR | 10-2005-0002011 | 1/2005 |

OTHER PUBLICATIONS

Notice of Preliminary Rejection from the Korean Intellectual Property Office, dated Oct. 25, 2006, in counterpart Korean Patent Application No. 2005-0080246.
Seong Keun Kim et al. "High Dielectric Constant $TiO_2$ Thin Films on a Ru Electrode Grown at 250 °C by Atomic-Layer Deposition," Applied Physics Letters, vol. 85, pp. 4112-4114 (2004).

* cited by examiner

*Primary Examiner*—Walter L Lindsay, Jr.
*Assistant Examiner*—Mohsen Ahmadi
(74) *Attorney, Agent, or Firm*—Finnegan, Henderson, Farabow, Garrett & Dunner, L.L.P.

(57) ABSTRACT

A semiconductor device with a dielectric structure and a method for fabricating the same are provided. A capacitor in the semiconductor device includes: a bottom electrode formed on a substrate; a first dielectric layer made of titanium dioxide ($TiO_2$) in rutile phase and formed on the bottom electrode; and an upper electrode formed on the first dielectric layer.

29 Claims, 3 Drawing Sheets

SEMICONDUCTOR DEVICE WITH DIELECTRIC STRUCTURE AND METHOD FOR FABRICATING THE SAME

FIELD OF THE INVENTION

The present invention relates to a semiconductor memory device and a method for fabricating the same; and, more particularly, to a semiconductor device provided with a dielectric layer made of titanium dioxide ($TiO_2$) in rutile phase and a method for fabricating the same.

DESCRIPTION OF RELATED ARTS

For a semiconductor memory device, e.g., a DRAM device, the size of a memory cell region for storing 1 bit is becoming smaller as the degree of integration is increasing. Herein, 1 bit is the basic unit for memory information. However, the size of a capacitor cannot be reduced in proportion to the memory cell region reduction. This result is because a dielectric capacity above a certain level is required for each of the unit cells to prevent soft errors and maintain stable operations. Thus, researches for maintaining the capacity of the capacitor within the limited cell region above the certain level is being demanded. Such researches have progressed in three difference ways. The first one is a method for reducing the thickness of a dielectric layer, the second one is a method for increasing an active region of a capacitor, and the third one is a method for utilizing a dielectric layer with a high relative dielectric constant.

Below, the method for utilizing a dielectric layer with a high relative dielectric constant is described in detail. A mainly used dielectric layer in a conventional capacitor includes a silicon dioxide ($SiO_2$) thin layer and a nitride-oxide (NO) thin layer and an oxide-nitride-oxide (ONO) thin layer using silicon nitride ($Si_3N_4$) with a dielectric constant two times higher than the one of the $SiO_2$ thin layer.

However, the $SiO_2$, NO and ONO thin layers have low dielectric constants. Even if the thickness of the dielectric layer is reduced or the surface region of the dielectric layer is enlarged, there still exists a limitation in increasing the dielectric constant. Thus, using a material with a high dielectric constant is becoming essentially required.

As a result, materials such as titanium dioxide ($TiO_2$), hafnium oxide ($HfO_2$), tantalum oxide ($Ta_2O_5$), zirconium dioxide ($ZrO_2$) and aluminum oxide ($Al_2O_3$) are introduced to replace the conventional dielectric layer in a highly-integrated DRAM. Table 1 below shows the dielectric constants and band gap energy levels of such dielectric layers.

TABLE 1

|  | $Al_2O_3$ | $HfO_2$ | $Ta_2O_5$ | $ZrO_2$ | $TiO_2$ (Rutile) |
|---|---|---|---|---|---|
| Dielectric constant | 8 | 23 | 26 | 25 | 90-170 |
| Band gap (eV) | 8.8 | 6 | 4.4 | 5.8 | 3.1 |

As shown in Table 1, $HfO_2$ has a high dielectric constant of 23. However, $HfO_2$ has a heat stability problem due to a low crystallization temperature, resulting in high leakage current. Thus, it may be difficult to apply $HfO_2$ solely. To overcome such problems, a structure wherein an $Al_2O_3$ layer is formed on a $HfO_2$ layer has been introduced conventionally. However, such structure causes losses of the dielectric capacity due to the low dielectric constant ($\epsilon$) of $Al_2O_3$, (i.e., $\epsilon=8$).

If $TiO_2$ is formed as a thin layer, $TiO_2$ forms in anatase phase, causing losses of the dielectric capacity. On the other hand, $TiO_2$ formed in rutile phase has a high dielectric constant, but has low band gap energy of 3.1, resulting in a deteriorated leakage current characteristic.

SUMMARY OF THE INVENTION

It is, therefore, an object of the present invention to provide a capacitor in a semiconductor device capable of maintaining a dielectric capacity and improving a leakage current characteristic, and a method for fabricating the same.

Another object of the present invention is to provide a non-volatile memory device capable of increasing a coupling ratio and improving a leakage current characteristic, and a method for fabricating the same.

In accordance with an aspect of the present invention, there is provided a capacitor in a semiconductor device, including: a bottom electrode formed on a substrate; a first dielectric layer made of titanium dioxide ($TiO_2$) in rutile phase and formed on the bottom electrode; and an upper electrode formed on the first dielectric layer.

In accordance with another aspect of the present invention, there is provided a method for fabricating a capacitor in a semiconductor device, including: preparing a substrate whereon a bottom electrode is formed; forming a first dielectric layer made of $TiO_2$ on the bottom electrode; transforming the first dielectric layer into a rutile phase; and forming an upper electrode on the transformed first dielectric layer.

In accordance with still another aspect of the present invention, there is provided a non-volatile memory device, including: a gate insulation layer formed on a substrate; a floating gate formed on the gate insulation layer; a first dielectric layer made of $TiO_2$ in rutile phase and formed on the floating gate; and a control gate formed on the first dielectric layer.

In accordance with further aspect of the present invention, there is provided a method for fabricating a non-volatile memory device, including: forming a gate insulation layer on a substrate; forming a floating gate on the gate insulation layer; forming a first dielectric layer made of $TiO_2$ on the floating gate; transforming the first dielectric layer into a rutile phase; and forming a control gate on the transformed first dielectric layer.

BRIEF DESCRIPTION OF THE DRAWINGS

The above and other objects and features of the present invention will become better understood with respect to the following description of the specific embodiments given in conjunction with the accompanying drawings, in which.

DETAILED DESCRIPTION OF THE INVENTION

Figure 1:
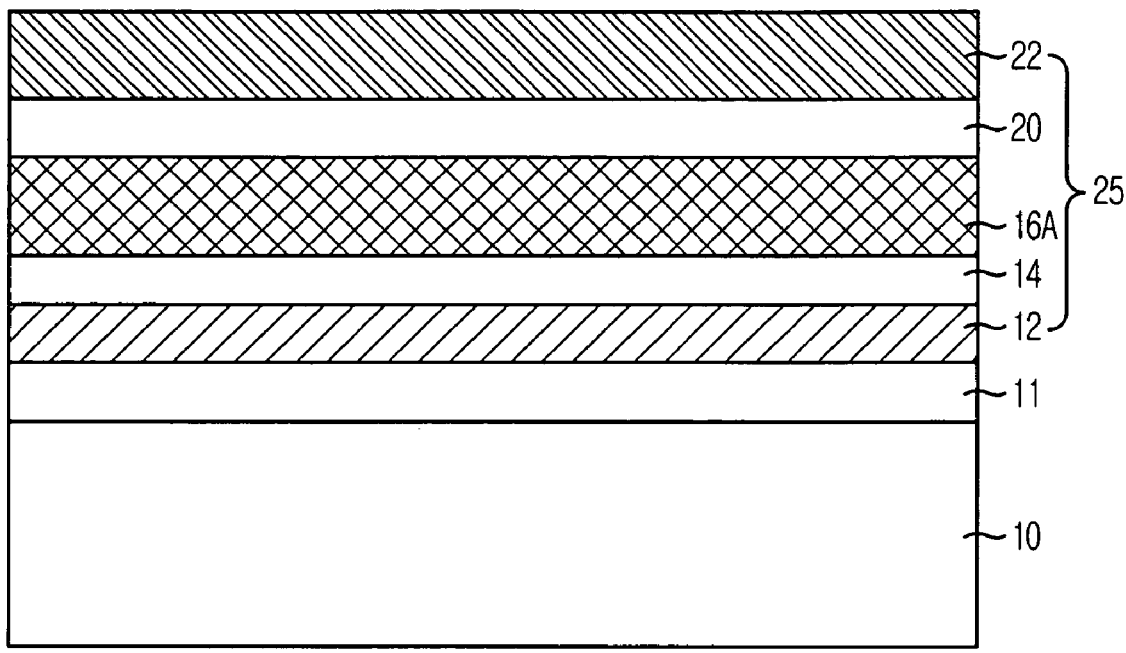
FIG. 1 is a cross-sectional view illustrating a capacitor in a semiconductor device in accordance with a specific embodiment of this present invention.

A semiconductor device with a dielectric structure and a method for fabricating the same in accordance with specific embodiments of the present invention will be described in detail with reference to the accompanying drawings. Also, regarding the drawings, the illustrated thickness of layers and regions are exaggerated for definitude. When a first layer is referred to as being on a second layer or "on" a substrate, it could mean that the first layer is formed directly on the second layer or the substrate, or it could also mean that a third layer may exit between the first layer and the substrate. Furthermore, identical reference numerals through out the specific embodiments of the present invention represent identical or like elements.

Hereinafter, a first embodiment of the present invention will be described in detail.

Especially, when titanium oxide ($TiO_2$) grows in rutile phase, a very high dielectric constant can be obtained. However, when $TiO_2$ grows in anatase phase, the dielectric constant is approximately 40, which is extremely low when compared with $TiO_2$ in rutile phase. For reference, physical constants of $TiO_2$ in rutile phase and in anatase phase are shown in table 2 below.

TABLE 2

| Crystallographic phase | Lattice constant (nm) | | | | Density ($kg/m_3$) |
| --- | --- | --- | --- | --- | --- |
| | a | b | c | c/a | |
| Rutile (tetragonal) | 0.4584 | — | 0.593 | 0.644 | 4240 |
| Anatase (tetragonal) | 0.3733 | — | 0.937 | 2.51 | 3830 |

In accordance with the first embodiment of the present invention, a dielectric layer made of $TiO_2$ in rutile phase with a high dielectric constant ($\epsilon$) of approximately 90 to approximately 170 is provided. As a result, a semiconductor memory device provided with the aforementioned dielectric layer in accordance with the first embodiment of the present invention can obtain a sufficient dielectric capacity.

Also, in accordance with the first embodiment of the present invention, additional dielectric layers can be formed on top and at the bottom of the dielectric layer made of $TiO_2$ in rutile phase. Herein, the additional dielectric layers are made of a material with high band gap energy and less reactivity with metals. For example, additional dielectric layers made of $Al_2O_3$ are formed on top and at the bottom of the dielectric layer made of $TiO_2$ in rutile phase. As a result, a leakage current characteristic of this semiconductor memory device is improved, wherein the semiconductor memory device is provided with the dielectric structure of $Al_2O_3/TiO_2$ in rutile phase/$Al_2O_3$ in accordance with the first embodiment of the present invention.

Hereinafter, a second embodiment of the present invention will be described in detail.

The dielectric layer in accordance with the first embodiment of the present invention can be applied to a capacitor dielectric layer in a DRAM device. FIG. 1 is a cross-sectional view illustrating the capacitor in the DRAM device formed in accordance with the second embodiment of the present invention, wherein the second embodiment is an example whereto the first embodiment of the present invention is applied.

Referring to FIG. 1, the capacitor includes: a substrate 10 whereon bit lines are formed, although not illustrated; an inter-layer dielectric (ILD) layer 11 formed on the substrate 10; a bottom electrode 12 formed on the ILD layer 11; a first dielectric layer 16A made of $TiO_2$ in rutile phase formed on the bottom electrode 12; and an upper electrode 22 formed on the first dielectric layer 16A.

Also, the capacitor in accordance with the second embodiment of the present invention further includes: a second dielectric layer 14 formed between the bottom electrode 12 and the first dielectric layer 16A to improve an interfacial characteristic; and a third dielectric layer 20 formed between the upper electrode 22 and the first dielectric layer 16A to improve an interfacial characteristic.

Herein, the bottom electrode 12 and the upper electrode 22 are formed with a metal. Preferably, ruthenium (Ru) is used. Thus, a metal-insulator-metal (MIM) capacitor 25 provided with metal electrodes is formed.

Furthermore, the second dielectric layer 14 and the third dielectric layer 20 are formed with a material which has a good interfacial characteristic with respect to the bottom electrode 12 and the upper electrode 22. Preferably, $Al_2O_3$ is used. $Al_2O_3$ is used because $Al_2O_3$ has less reactivity with the bottom electrode 12 and the upper electrode 22 both made of a metal, and also because $Al_2O_3$ can effectively prevent oxygen penetration. In detail, $Al_2O_3$ has a dense layer property and a superior surface roughness characteristic. The binding energy between aluminum (Al) and atomic oxygen (O) in $Al_2O_3$ is very strong, resulting in less reactivity with metals and effective impediment of oxygen penetration.

That is, by employing the first dielectric layer 16A made of $TiO_2$ in rutile phase in the capacitor of the semiconductor device in accordance with the second embodiment of the present invention, a sufficient dielectric capacity can be obtained. However, although $TiO_2$ in rutile phase has a high dielectric constant, $TiO_2$ in rutile phase has low band gap energy, resulting in deterioration of the leakage current characteristic.

Therefore, to improve the leakage current characteristic, the second dielectric layer 14 and the third dielectric layer 20 are additionally formed at the bottom and on top and of the first dielectric layer 16A in the second embodiment of the present invention. That is, the leakage current characteristic can be improved by employing a material which has a superior interfacial characteristic with respect to the bottom electrode 12 and the upper electrode 22 and has high band gap energy, i.e., the second dielectric layer 14 and the third dielectric layer 20 made of $Al_2O_3$.

Figure 2:
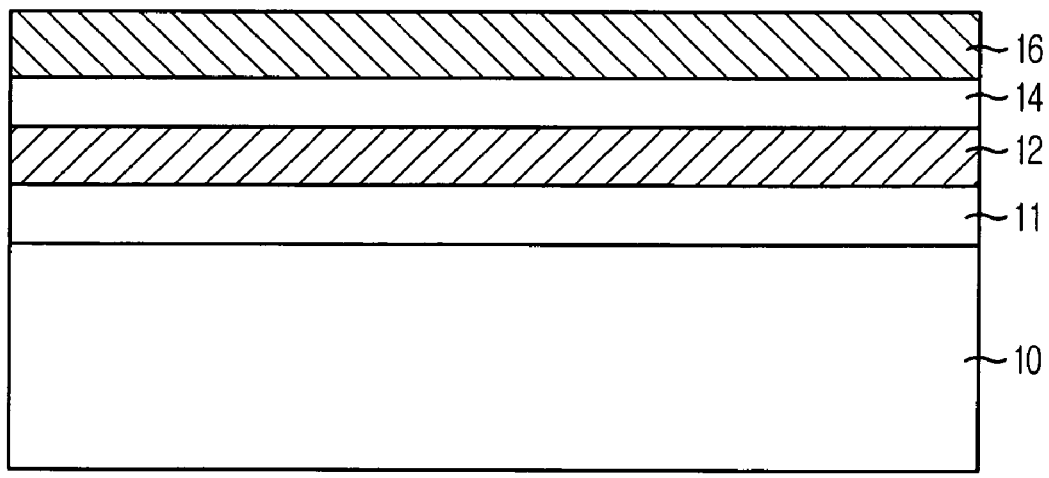
FIGS. 2 to 4 are cross-sectional views illustrating a method for fabricating the capacitor in the semiconductor device in FIG. 1.
Figure 3:
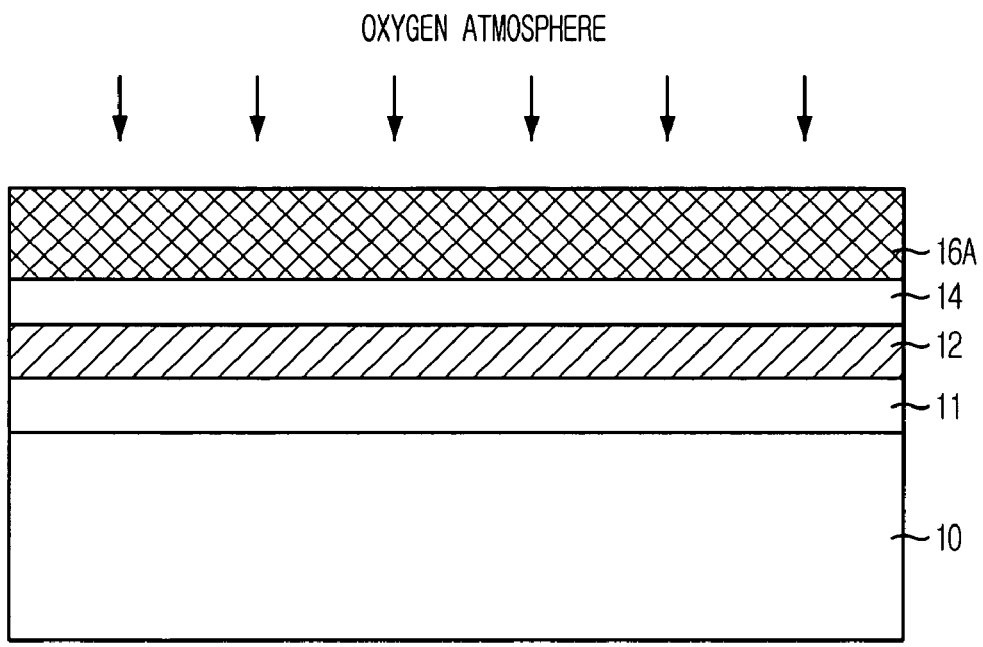
Figure 4:
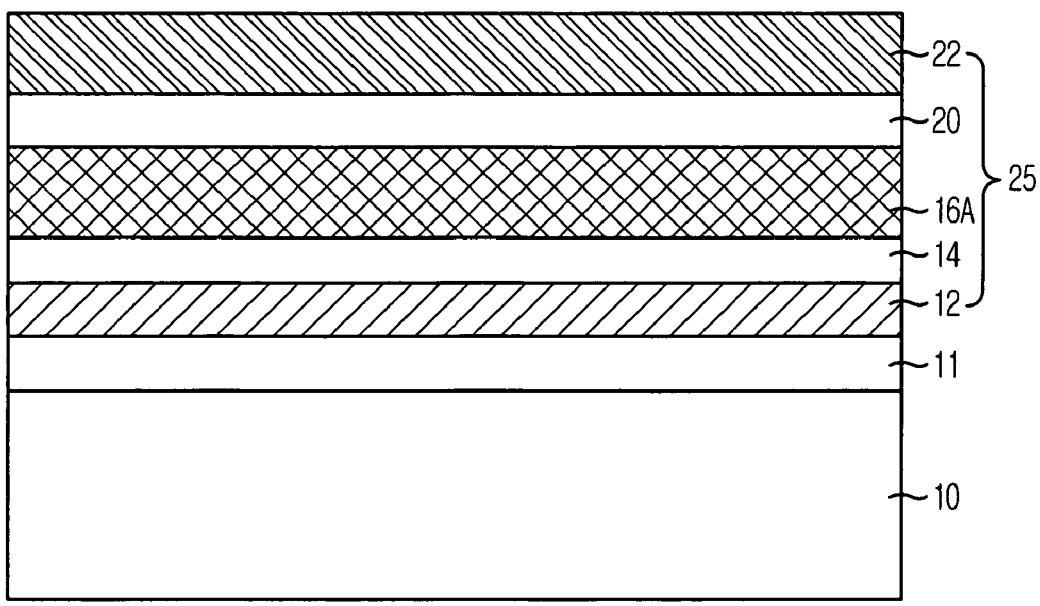

In the following, a method for fabricating a capacitor in a semiconductor device in accordance with the second embodiment of the present invention is described. FIGS. 2 to 4 are cross-sectional views illustrating the fabrication method of the capacitor illustrated in FIG. 1.

Firstly, as shown in FIG. 2, the ILD layer 11 is formed on the substrate 10 whereon a transistor and bit lines are already formed. Herein, the ILD layer 11 is formed with an oxide-based material. For example, the ILD layer 11 is formed in a single layer or a stacked layer by employing one or more of a high density plasma (HDP) oxide layer, a boro-phospho-silicate glass (BPSG) layer, a phosphosilicate glass (PSG) layer, a plasma enhanced tetraethyl orthosilicate (PETEOS) layer, a plasma enhanced chemical vapor deposition (PECVD) layer, an undoped silicate glass (USG) layer, a fluorinated silicate glass (FSG) layer, a carbon doped oxide (CDO) layer, and an organic silicate glass (OSG) layer.

Next, a contact hole, although not illustrated, exposing a predetermined portion of the substrate 10 is formed by etching the ILD layer 11 through a mask process and an etching process. Subsequently, a layer of a plug material is formed over the above resulting substrate structure, filling the contact hole, and then an etch-back process or a chemical mechanical polishing (CMP) process is performed to form a contact plug, although not illustrated, buried in the contact hole.

Furthermore, the bottom electrode 12 is formed by forming a layer of a metallic material (i.e. Ru) over the ILD layer 11 including the contact plug. For example, a Ru layer is formed by utilizing $Ru(OD)_3(Ru(C_3H_{13}O_2)_3)$ or $Ru(EtCp)_2(Ru$ ($C_7H_8$)2) as a Ru source gas, and oxygen ($O_2$) or ammonia ($NH_3$) as a reaction gas. Also the Ru layer is formed by employing one of a chemical vapor deposition (CVD) method and an atomic layer deposition (ALD) method. Preferably, the bottom electrode 12 is formed with Ru by employing the ALD method in a thickness ranging from approximately 200 Å to approximately 800 Å.

Moreover, the second dielectric layer 14 is formed on the bottom electrode 12 in a thickness ranging from approximately 5 Å to approximately 30 Å. Herein, the second dielectric layer 14 is formed to prevent deterioration of the interfacial characteristic between the bottom electrode 12 and the first dielectric layer 16A to be formed later on the second dielectric layer 14, as well as to prevent oxidation of the bottom electrode 12 caused by oxygen penetration during a follow-up process. Preferably, the second dielectric layer 14 is formed with $Al_2O_3$. $Al_2O_3$ is preferred because: $Al_2O_3$ has a dense layer property and a superior surface roughness characteristic; the binding energy between aluminum (Al) and atomic oxygen (O) in $Al_2O_3$ is very strong, resulting in less reactivity with metal electrodes; and $Al_2O_3$ can effectively block oxygen penetration. Also, $Al_2O_3$ has high band gap energy and high contact potential with the bottom electrode 12, and thus, the leakage current characteristic can be improved by using $Al_2O_3$ as a dielectric layer.

Herein, $Al_2O_3$ is formed by utilizing trimethylamine (TMA) as an Al source gas, and ozone ($O_3$) or water ($H_2O$) as a reaction gas through an ALD method.

Then, a premature first dielectric layer 16 is formed on the second dielectric layer 14. Herein, the premature first dielectric layer 16 is formed by employing an ALD method using a mixed gas of $Ti(OC_3H_7)_4$ (TTIP) and $O_3$ as a source gas. Preferably, the premature first dielectric layer 16 is formed with $TiO_2$ in a thickness ranging from approximately 10 Å to approximately 200 Å at a temperature ranging from approximately 200° C. to approximately 450° C.

It is important to let the $O_3$ gas flow in as much as possible during the formation of the premature first dielectric layer 16 to help the premature first dielectric layer 16 to grow maximally into a rutile phase. Preferably, the inflow of the $O_3$ gas ranges from approximately 200 g/m³ to approximately 500 g/m³.

The above described technology of growing $TiO_2$ into a rutile phase by controlling the $O_3$ inflow had been already introduced by Seungkeun Kim, et al., entitled "High Dielectric Constant $TiO_2$ Thin Layers on an Electrode Grown at 250° C. by Atomic Layer Deposition.", *Applied Physics Letters*, 85, p. 4112, 2004.

Next, as shown in FIG. 3, an oxidation plasma treatment or an oxygen ion beam irradiation process in an oxygen atmosphere is performed to change portions of the premature first dielectric layer 16 (refer to FIG. 2), which did not grow into the rutile phase but remains in anatase phase, into the rutile phase. For example, during the oxidation plasma treatment, a mixed gas of $O_2$/nitrogen ($N_2$) or dinitrogen oxide ($N_2O$)/$N_2$ is utilized, and power ranging from approximately 100 W to approximately 1,000 W is supplied. On the other hand, during the oxygen ion beam irradiation process, an oxygen ion beam ($O2^+$) with an energy level ranging from approximately 50 eV to approximately 200 eV is irradiated at a dose ranging from approximately 0.1 mA/cm² to approximately 100 mA/cm². Thus, the aforementioned first dielectric layer 16A made of $TiO_2$ in rutile phase is formed.

Subsequently, as shown FIG. 4, the third dielectric layer 20 is formed on the first dielectric layer 16A. Herein, the third dielectric layer 20 is formed to prevent deterioration of the interfacial characteristic between the first dielectric 16A and the upper electrode 22 to be formed later. Preferably, the third dielectric layer 20 is formed with $Al_2O_3$ in a thickness ranging from approximately 5 Å to approximately 30 Å. $Al_2O_3$ is preferred because: $Al_2O_3$ has a dense layer property and a superior surface roughness characteristic; the binding energy between Al and O in $Al_2O_3$ is very strong, resulting in less reactivity with metal electrodes; and $Al_2O_3$ can effectively block oxygen penetration. Also, $Al_2O_3$ has high band gap energy and high contact potential with the bottom electrode 12, and thus, the leakage current characteristic can be improved by using $Al_2O_3$ as a dielectric layer.

Herein, $Al_2O_3$ is formed by utilizing TMA as an Al source gas, and $O_3$ or $H_2O$ as a reaction gas through an ALD method.

Furthermore, the upper electrode 22 is formed on the third dielectric layer 20 by employing a metallic material, i.e., Ru. For example, a Ru layer is formed by utilizing $Ru(OD)_3$(Ru $(C_3H_{13}O_2)_3$) or $Ru(EtCp)_2(Ru(C_7H_8)_2)$ as a Ru source gas, and $O_2$ or $NH_3$ as a reaction gas. Also, the Ru layer is formed by employing one of a CVD method and an ALD method. Preferably, the upper electrode 22 is formed with Ru by employing the ALD method in a thickness ranging from approximately 200 Å to approximately 800 Å.

The bottom electrode 12 and the upper electrode 22 are formed with a metal, i.e., Ru. Thus, the MIM capacitor 25 provided with metal electrodes is formed.

Hereinafter, a third embodiment of the present invention will be described in detail.

Figure 5:
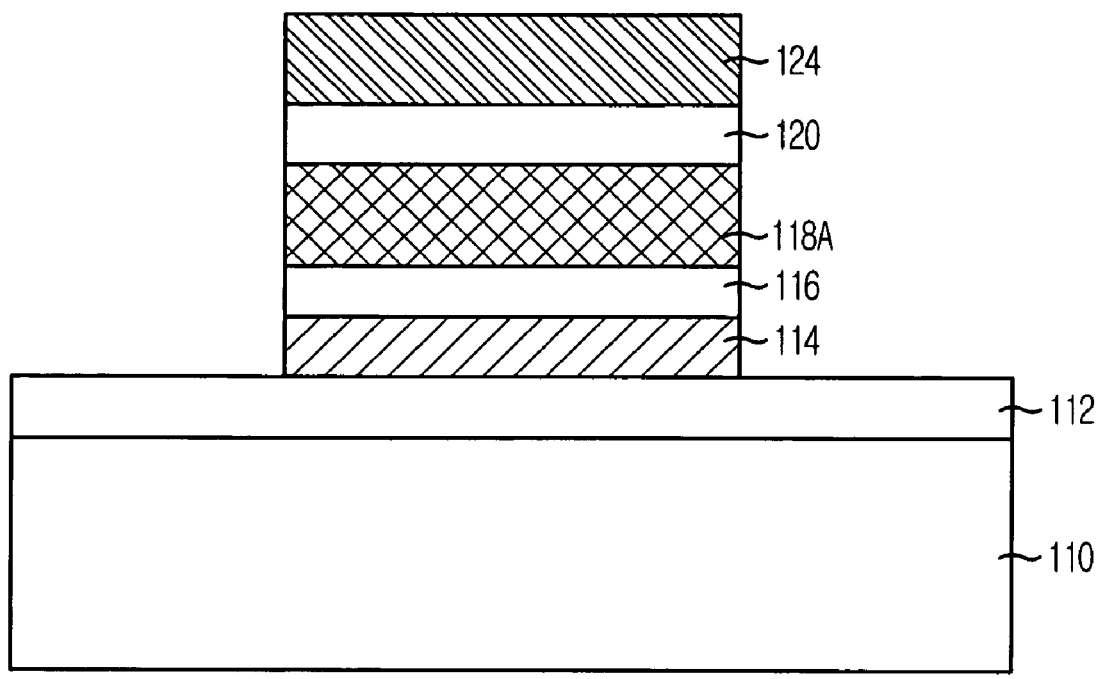
FIG. 5 is a cross-sectional view illustrating a non-volatile memory device in accordance with another specific embodiment of this present invention.

A dielectric layer in accordance with the specific embodiments of the present invention can be applied to an inter-poly dielectric (IPD) structure or an inter-poly oxide (IPO) structure in a non-volatile memory device. FIG. 5 is a cross-sectional view illustrating a non-volatile memory device formed in accordance with the third embodiment of the present invention, wherein the third embodiment is an example whereto the first embodiment of the present invention is applied.

Referring to FIG. 5, the non-volatile memory device includes: a gate insulation layer 112 formed on a substrate 110; a floating gate 114 formed on a portion of the gate insulation layer 112; a first dielectric layer 118A made of $TiO_2$ in rutile phase and formed on the floating gate 114; and a control gate 124 formed on the first dielectric layer 118A. The floating gate 114 and the control gate 124 are formed with polysilicon.

Also, the non-volatile memory device further includes: a second dielectric layer 116 formed between the floating gate 114 and the first dielectric layer 118A to improve an interfacial characteristic; and a third dielectric layer 120 formed between the control gate 124 and the first dielectric layer 118A to improve an interfacial characteristic.

Herein, the second dielectric layer 116 and the third dielectric layer 120 are formed with a material, which has a superior band gap characteristic. Preferably, $Al_2O_3$ is used. Thus, leakage current generated as electric charges stored in the floating gate 114 leak out can be reduced.

That is, a coupling ratio of the non-volatile memory device is increased by employing the first dielectric layer 118A made of $TiO_2$ in rutile phase. For reference, the coupling ratio of the non-volatile memory device is proportionate to the capacitance of the dielectric layers (i.e., the first dielectric layer to the third dielectric layer 118, 116 and 120) existing between the floating gate 114 and the control gate 124. Furthermore, a leakage current characteristic of the non-volatile memory device can be improved by forming the second dielectric layer 116 and the third dielectric layer 120, both made of $Al_2O_3$ with high band gap energy, on top and at the bottom of the first dielectric layer 118A.

A fabrication method of the non-volatile memory device illustrated in FIG. 5 is described below.

Firstly, an oxidation process is performed to form the gate insulation layer 112 on a portion of the substrate 110. Next, a layer of a gate material (i.e., polysilicon) is formed on a portion of the gate insulation layer 112 and then etched to form the floating gate 114.

Subsequently, the second dielectric layer 116 is formed on the floating gate 114. Herein, the second dielectric layer 116 is formed with a material, which has a superior band gap characteristic, i.e., $Al_2O_3$. Preferably, $Al_2O_3$ is formed by utilizing TMA as an Al source gas, and $O_3$ or $H_2O$ as a reaction gas through an ALD method.

Furthermore, a premature first dielectric layer 118 made of $TiO_2$ is formed on the second dielectric layer 116. Herein, the premature first dielectric layer 118 is formed by employing an ALD method, which utilizes a mixed gas of $Ti(OC_3H_7)_4$ (TTIP) and $O_3$ as a source gas. Preferably, the premature first dielectric layer 118 is formed with $TiO_2$ at a temperature ranging from approximately 200° C. to approximately 450° C. in a thickness ranging from approximately 10 Å to approximately 200 Å.

It is important to let the $O_3$ gas flow in as much as possible during the formation of the premature first dielectric layer 118 to help the premature first dielectric layer 118 made of $TiO_2$ to grow maximally into a rutile phase. Preferably, the inflow of the $O_3$ gas ranges from approximately 200 $g/m^3$ to approximately 500 $g/m^3$.

Moreover, an oxidation plasma treatment or an oxygen ion beam irradiation process in an oxygen atmosphere is performed to change portions of the premature first dielectric layer 118, which did not grow into the rutile phase but remains in anatase phase, into the rutile phase. For example, during the oxidation plasma treatment, a mixed gas of $O_2/N_2$ or $N_2O/N_2$ is utilized, and power ranging from approximately 100 W to approximately 1,000 W is supplied. On the other hand, during the oxygen ion beam irradiation process, an oxygen ion beam ($O2^+$) with an energy level ranging from approximately 50 eV to approximately 200 eV is irradiated at a dose ranging from approximately 0.1 $mA/cm^2$ to approximately 100 $mA/cm^2$. Thus, the first dielectric layer 118A made of $TiO_2$ in rutile phase is formed.

Next, the third dielectric layer 120 is formed on the first dielectric layer 118A. Herein, the third dielectric layer 120 is formed with a material, which has a superior band gap characteristic, i.e., $Al_2O_3$. Preferably, $Al_2O_3$ is formed by utilizing TMA as an Al source gas, and $O_3$ or $H_2O$ as a reaction gas through an ALD method.

Then, a layer of a gate material (i.e. polysilicon) is formed on the third dielectric layer 120 and etched to form the control gate 124.

In accordance with one specific embodiment of the present invention, a dielectric characteristic of a capacitor can be improved by forming the capacitor with a dielectric layer made of $TiO_2$ in rutile phase which has a very high dielectric constant. Furthermore, a leakage current characteristic of the capacitor can be improved by forming other dielectric layers with a superior band gap characteristic (i.e. $Al_2O_3$) between the dielectric layer made of $TiO_2$ in rutile phase, an upper electrode and a bottom electrode.

Thus, the leakage current characteristic of the capacitor can be improved without deteriorating the dielectric characteristic.

Furthermore, in accordance with another specific embodiment of the present invention, a coupling ratio of a non-volatile memory device can be increased by forming the non-volatile memory device with a dielectric layer made of $TiO_2$ in rutile phase with a high dielectric constant. Moreover, a leakage current characteristic of the non-volatile memory device can be improved by forming dielectric layers with a superior band gap characteristic (i.e. $Al_2O_3$) between the dielectric layer made of $TiO_2$ in rutile phase, the floating gate and the control gate.

Thus, the coupling ratio can be increased and the leakage current characteristic can be improved in the non-volatile memory device.

The present application contains subject matter related to the Korean patent application No. KR 2005-0080246, filed in the Korean Patent Office on Aug. 30, 2005, the entire contents of which being incorporated herein by reference.

While the present invention has been described with respect to certain specific embodiments, it will be apparent to those skilled in the art that various changes and modifications may be made without departing from the spirit and scope of the invention as defined in the following claims.

What is claimed is:

1. A method for fabricating a capacitor in a semiconductor device, comprising:
   preparing a substrate whereon a bottom electrode is formed;
   forming a second dielectric layer made of $Al_2O_3$ on the bottom electrode;
   forming a first dielectric layer made of $TiO_2$ on the second dielectric layer;
   transforming the first dielectric layer into a rutile phase;
   forming a third dielectric layer made of $Al_2O_3$ on the first dielectric layer; and
   forming an upper electrode on the third dielectric layer;
   wherein the second dielectric layer is formed to improve an interfacial characteristic between the bottom electrode and the first dielectric layer, and the third dielectric layer is formed to improve an interfacial characteristic between the first dielectric layer and the upper electrode.

2. The method of claim 1, wherein the transforming of the first dielectric layer into the rutile phase includes performing one of an oxidation plasma process and an oxygen ion beam irradiation process.

3. The method of claim 2, wherein the oxidation plasma process is performed by supplying plasma power ranging from approximately 100 W to approximately 1,000 W.

4. The method of claim 3, wherein the oxidation plasma process utilizes one of an $O_2/N_2$ mixed gas and a $N_2O/N_2$ mixed gas.

5. The method of claim 2, wherein the oxidation plasma process utilizes one of an oxygen ($O_2$)/nitrogen ($N_2$) mixed gas and a dinitrogen oxide ($N_2O$)/$N_2$ mixed gas.

6. The method of claim 2, wherein the oxygen ion beam irradiation process irradiates an oxygen ion beam with energy ranging from approximately 50 eV to approximately 200 eV at a dose ranging from approximately 0.1 $mA/cm^2$ to approximately 100 $mA/cm^2$.

7. The method of claim 1, wherein the forming of the first dielectric layer includes performing an atomic layer deposition (ALD) method.

8. The method of claim 7, wherein the forming of the first dielectric layer utilizes a mixed gas of $Ti(OC_3H_7)_4$ (TTIP) and ozone ($O_3$) as a source gas.

9. The method of claim 8, wherein the $O^3$ gas is flowed in an amount ranging from approximately 200 $g/m^3$ to approximately 500 $g/m^3$.

10. The method of claim 1, wherein the forming of the second dielectric layer includes performing an ALD method.

11. The method of claim 1, wherein the forming of the second dielectric layer utilizes trimethylamine (TMA) as a source gas and one of $O_3$ and water ($H_2O$) as a reaction gas.

12. The method of claim 1, wherein the forming of the third dielectric layer includes performing an ALD method.

13. The method of claim 1, wherein the forming of the third dielectric layer utilizes TMA as a source gas and one of $O_3$ and $H_2O$ as a reaction gas.

14. The method of claim 1, wherein the bottom electrode and the upper electrode are formed with Ru.

15. The method of claim 14, wherein the bottom electrode and the upper electrode are formed by performing one of a chemical vapor deposition (CVD) method and the ALD method.

16. The method of claim 15, wherein the bottom electrode and the upper electrode are formed by utilizing one of $Ru(OD)_3(Ru(C_3H_{13}O_2)_3)$ and $Ru(EtCp)_2(Ru(C_7H_8)_2)$ as a source gas, and one of $O_3$ and $H_2O$ as a reaction gas.

17. A method for fabricating a non-volatile memory device, comprising:
   forming a gate insulation layer on a substrate;
   forming a floating gate on the gate insulation layer;
   forming a second dielectric layer made of $Al_2O_3$ on the floating gate;
   forming a first dielectric layer made of $TiO_2$ on the second dielectric layer;
   transforming the first dielectric layer into a rutile phase;
   forming a third dielectric layer made of $Al_2O_3$ on the transformed first dielectric layer; and
   forming a control gate on the third dielectric layer;
   wherein the second dielectric layer is formed to improve an interfacial characteristic between the floating gate and the first dielectric layer, and the third dielectric layer is formed to improve an interfacial characteristic between the first dielectric layer and the control gate.

18. The method of claim 17, wherein the transforming of the first dielectric layer into the rutile phase includes performing one of an oxidation plasma process and an oxygen ion beam irradiation process.

19. The method of claim 18, wherein the oxidation plasma process supplies plasma power ranging from approximately 100 W to approximately 1,000 W.

20. The method of claim 19, wherein the oxidation plasma process utilizes one of an $O_2/N_2$ mixed gas and a $N_2O/N_2$ mixed gas.

21. The method of claim 18, wherein the oxidation plasma process utilizes one of an $O_2/N_2$ mixed gas and a $N_2O/N_2$ mixed gas.

22. The method of claim 18, wherein the oxygen ion beam irradiation process irradiates energy ranging from approximately 50 eV to approximately 200 eV at a dose ranging from approximately 0.1 mA/cm$^2$ to approximately 100 mA/cm$^2$.

23. The method of claim 17, wherein the forming of the first dielectric layer includes performing an ALD method.

24. The method of claim 23, wherein the forming of the first dielectric layer utilizes a mixed gas of $Ti(OC_3H_7)_4$ (TTIP) and $O_3$ as a source gas.

25. The method of claim 24, wherein the $O_3$ gas is flowed in an amount ranging from approximately 200 g/m$^3$ to approximately 500 g/m$^3$.

26. The method of claim 17, wherein the forming of the second dielectric layer includes performing an ALD method.

27. The method of claim 17, wherein the forming of the second dielectric layer utilizes TMA as a source gas and one of $O_3$ and $H_2O$ as a reaction gas.

28. The method of claim 17, wherein the forming of the third dielectric layer includes performing an ALD method.

29. The method of claim 17, wherein the forming of the third dielectric layer utilizes TMA as a source gas and one of $O_3$ and $H_2O$ as a reaction gas.

* * * * *